United States Patent [19]

Singer

[11] Patent Number: 4,574,239

[45] Date of Patent: Mar. 4, 1986

[54] METHOD FOR FLOW MEASUREMENT USING NUCLEAR MAGNETIC RESONANCE

[75] Inventor: Jerome R. Singer, Berkeley, Calif.

[73] Assignee: The Regents of the University of California, Berkeley, Calif.

[21] Appl. No.: 515,336

[22] Filed: Jul. 19, 1983

[51] Int. Cl.[4] .............................................. G01R 33/20
[52] U.S. Cl. .................................... 324/306; 324/309; 128/653
[58] Field of Search ............... 324/306, 309, 300, 307; 128/653

[56] References Cited

U.S. PATENT DOCUMENTS

| 4,297,637 | 10/1981 | Crooks et al. | 324/309 |
| 4,318,043 | 3/1982 | Crooks et al. | 324/309 |
| 4,516,075 | 5/1985 | Moran | 324/309 |

OTHER PUBLICATIONS

Crooks et al., "Nuclear Magnetic Rsonance Whole--Body Imager Operating at 3.5 KGauss[1]", *Radiology*, vol. 143, No. 1, pp. 169–174, Apr. 1982.

Garroway, "Velocity Measurements in Flowing Fluids by NMR", *J. Phys. D: Appl. Phys.*, vol. 7, pp. L159–L163, Great Britain, 1974.

*Primary Examiner*—Reinhard J. Eisenzopf
*Assistant Examiner*—Kevin D. O'Shea
*Attorney, Agent, or Firm*—Townsend and Townsend

[57] ABSTRACT

Quantitative volumetric flow rates within highly defined regions are determined by a novel technique in which nuclear magnetic resonance is used to determine the fill time for the region of interest. The technique involves the combination of a depolarization pulse (or series of pulses) and a signal generating pulse (or series of pulses), both applied to a specific tomographic region and separated from each other by a time interval of varying length. The pulses are designed to cancel each other out in terms of signal generation, and the signal detected is therefore attributable to matter flowing into the region during the interval between the pulses. The fill time is determined from a plot of signal intensity vs. interval length. The process is readily combined with known NMR imaging techniques to provide a two-dimensional array of flow data.

34 Claims, No Drawings

METHOD FOR FLOW MEASUREMENT USING NUCLEAR MAGNETIC RESONANCE

BACKGROUND OF THE INVENTION

1. Field of the Invention

This invention relates to the measurement of the velocity of a moving substance by the use of nuclear magnetic resonance (NMR). In particular, this invention relates to the quantitative determination of the flow rates of flowing fluids across a given plane, and of the position dependence of such flow rates in the plane itself. The method requires no intrusion into the fluids or the surrounding matter by other than a large amplitude static magnetic field, a small amplitude radio frequency electromagnetic field, and pulsed small amplitude magnetic field gradients. Although useful for a broad range of applications, this invention finds particular utility in the field of medical diagnostics, and most particularly in the detection and measurement of blood flow rates in living animals and humans.

2. Description of the Prior Art

Techniques for the study of flowing fluids using nuclear magnetic resonance have been known for approximately 25 years. Such techniques generally involve the use of downstream detectors, saturation followed by inflow of unsaturated material, or the imposition of a field gradient to cause measurable frequency and phase shifts.

Descriptions of these techniques are found in the following papers:

J. R. Singer, "Blood Flow Rates by Nuclear Magnetic Resonance Measurements", *Science* 130: 1652 (1959);

J. R. Singer, "Flow Rates by Nuclear and Electron Paramagnetic Resonance Methods", *J. Appl. Phys.*, 31: 125 (1960);

T. P. Grover, "NMR Flow Measurements", Ph.D. Dissertation, University of California, Berkeley, Dept. of Electrical Engineering and Computer Sciences (1971);

T. Grover et al., "NMR Spin-Echo Flow Measurements", *J. Appl. Phys.*, 42: 938 (1971);

A. N. Garroway, "Velocity Measurements in Flowing Fluids by NMR", *Journal of Physics D: Applied Physics*, 7; L159 (1974);

J. R. Singer et al., "Recent Measurements of Flow Using Nuclear Magnetic Resonance Techniques", *Modern Developments in Flow Measurement*, G. C. Clayton, ed., Peter Peregrinus Ltd., London (1972) pp. 38–48;

P. A. Jager, et al. "Novel Method for Determination of Flow Velocities with Pulsed Nuclear Magnetic Resonance", *Rev. Sci. Instr.*, 49(8), (1978);

D. W. Jones et al., "NMR in Flowing Systems", *Advances in Magnetic Resonance*, Volume 8, J. S. Waugh, ed., Academic Press, N.Y. (1976);

L. F. Latyshev et al., "Nuclear Magnetic Resonance in a Flowing Liquid", Moscow: Atomizdat (1968);

K. J. Packer, "The Study of Slow Coherent Molecular Motion by Pulsed Nuclear Magnetic Resonance", *Molecular Physics*, 17: 355 (1969);

J. S. Battocletti, et al., "NMR Detection of Low Magnetization Levels in Flowing Fluids", *I.E.E.E. Transactions on Magnetics*, Vol. Mag. 9: 451 (1973);

R. E. Halbach, et al., "Cylindrical Crossed-Coil NMR Limb Blood Flowmeter", *Rev. Sci. Inst.*, 50 (4), (1979);

O. C. Morse et al., "Blood Velocity Measurements in Intact Subjects", *Science*, 170: 440 (1970).

The known techniques vary in complexity and accuracy as well as in their ability to detect flow rate variations from point to point over a broad area. Unfortunately, they are incapable of focusing on a specific portion of a large area, such as a single blood vessel or a selected capillary region within a cross-section of the human body, to provide quantitative flow data specific to that vessel or region.

The imaging of entire cross-sections by NMR without the generation of flow data is also well known. Several methods of generating such images have been disclosed, but all are directed primarily at providing relative nuclear densities representative of the internal structure of the subject at the instant the imaging is performed. Publications disclosing such techniques include the following:

Lauterbur, "Image Formation by Induced Local Interaction: Examples Employing Nuclear Magnetic Resonance", *Nature*, 242: 190 (1973);

Damadian et al., "Focusing Nuclear Magnetic Resonance (FONAR), Visualization of a Tumor in a Live Animal", *Science*, 194: 1430-2 (1976);

Hinshaw et al., "Display of Cross-Sectional Anatomy by Nuclear Magnetic Resonance Imaging", *Brit. J. Radiol.*, 51: 273 (1978);

Kumar et al., "NMR Fourier Zeugmatography", *J. Mag.Res.*, 18: 69–83 (1975);

Mansfield et al., "Planar Spin Imaging by NMR", *J. Phys. C: Solid State Physics*, 9: L409–412 (1976);

Edelstein et al., "Spin Warp NMR Imaging and Applications to Human Whole-Body Imaging", *Phys Med. Biol.*, 25(4): 751-6 (1980);

Crooks et al., "Nuclear Magnetic Resonance Whole-Body Imager Operating at 3.5 KGauss", *Radiology*, 143(1): 169–174 (1982);

Crooks et al., "Method and Apparatus for Rapid NMR Imaging of Nuclear Densities Within an Object", U.S. Pat. No. 4,318,043, Mar. 2, 1982;

Crooks et al., "Method and Apparatus for Mapping Lines of Nuclear Density Within an Object Using Nuclear Magnetic Resonance," U.S. Pat. No. 4,297,637, Oct. 27, 1981.

Summaries of the techniques described in the first five of these publications are given in each of the Crooks patents cited at the bottom of the list. Citations for further publications describing these and other techniques are also found in these patents.

If one could combine NMR flow measurement with NMR imaging to provide quantitative flow data as a function of position in a cross-sectional plane, one would be able to measure flow rates anywhere within an object without interfering with the flow itself. Such a technique would be a major advance in the technology of medical diagnostics since it would permit the determination of blood flow rates anywhere in the body without the use of injections or harmful radiations. One could safely and accurately determine in a direct in vivo manner, for example, the efficacy of blood additives for cardiovascular problems. The treatment of full or partial arterial blockages by the use of catheterization, as a further example, could be advanced enormously by using such a technique to view both the artery and catheter and to measure the rate of blood flow therethrough at the same time. A wide range of other applications will be apparent to those skilled in the art.

SUMMARY OF THE INVENTION

The present invention resides in a novel method for obtaining quantitative volumetric flow rates of a moving substance by the use of nuclear magnetic resonance. The generation of NMR signals in a tomographic region is preceded by a depolarization pulse applied to the same region, which prevents the emission of these signals from the nuclei which would otherwise have emitted them. The process is repeated a number of times, each time varying the time interval between the depolarization pulse and the first pulse used in the generation of the signals, until a curve is generated representing a plot of signal intensity vs. the length of the time interval. For a tomographic region through which material is flowing, the curve will have a positive slope at a zero time interval, and will approach a horizontal asymptote as the time interval increases. The point of intersection of the straight line tangent to the curve at point zero and the asymptote is then determined, and the value of the time interval at this point is taken. This value is equal to the time required to completely fill the tomographic region with material flowing at the prevailing flow rate. When combined with the volume of the region, which can be determined using known techniques, the fill time can be translated into a volumetric flow rate. Knowledge of the actual dimensions of the region will permit translation of the data into a linear displacement rate.

In a further aspect of the invention, the flow measurement is combined with an imaging process, whereby NMR signals can be differentiated according to their point of origin in a two-dimensional plane. Known two-dimensional NMR imaging techniques are used to break down the signals into a rectangular array of picture elements ("pixels"), the location of each pixel corresponding to the location in the tomographic slice of the nuclei from which the signal originated. A full array is generated for each value of the time interval mentioned in the preceding paragraph. A specific portion of each such array is selected to coincide with an area of interest, such as a selected blood vessel or capillary group, and the signals of all pixels within the selected portion are isolated and totaled. The totals are then plotted as a function of the time interval length, and the fill time for the selected area is determined from the resulting curve as described above. Depending on the number of pixels used and the number of images generated, flow rates in specific regions can be obtained to a high degree of resolution without requiring access to the interior of the region.

DETAILED DESCRIPTION OF THE INVENTION AND THE PREFERRED EMBODIMENTS

For a full understanding of how flow data is generated according to the present invention, the following discussion will individually address each of the primary features of the invention—the generation of the NMR signal, the means of achieving spatial selectivity, the nature and method of application of the depolarization pulse, the means of determining fill time, and the two-dimensional imaging technique. Although several of these features involve known technology, a review is offered in each case to place each feature in the context of the invention and to promote a full understanding of the invention in its entirety.

A. NMR Signal Generation

The basic concepts of NMR are well known, as are a variety of techniques for generating NMR signals. Detailed descriptions are found in the literature, notably the text by Farrar and Becker, entitled *Pulse and Fourier Transform NMR—Introduction to Theory and Methods*, Academic Press, New York (1971). The following is a brief summary of this technology as it applies to the present invention.

Certain types of nuclei, by virtue of the number of protons and neutrons therein, have a net magnetic moment which enables them to respond to a magnetic field. The effect of a magnetic field on such nuclei is to cause alignment of the spins in the field direction, or, more precisely, to cause the nuclei to precess about an axis parallel to the field direction. The precession frequency is directly proportional to the intensity of the magnetic field, the proportionality constant being the magnetogyric ratio for the nucleus in question. This relationship is known as the Larmor equation, and the frequency itself is commonly designated the Larmor frequency. The magnetic fields generally used in NMR applications are static and unidirectional, resulting in a nuclear spin alignment which is uniform throughout the object under study.

In addition to being under the influence of a magnetic field, the nuclei of interest are placed within the range of sensitivity of an NMR signal detector. The latter is generally a coil connected to a radio frequency (RF) signal receiver. The coil is appropriately oriented to detect signals emitted by nuclei which have been excited away from the equilibrium state by a particular energy increment. In the configuration generally used, the coil detects a signal only when the net macroscopic magnetization has a component in the plane perpendicular to the direction of the magnetic field. Thus, an energy increment which modifies the nuclear magnetization in this manner will cause a detectable signal to occur.

Excitation is accomplished by irradiating the nuclei with a carrier wave of a characteristic RF. For maximum effect, the carrier is oriented in a plane perpendicular to the direction of the magnetic field. If the frequency of the carrier is equal or very close to the precession frequency of the nuclei, the latter will undergo a change in angular momentum according to the Bloch equations. The result is a nutation of the nuclear spins away from the axis of the static magnetic field by an amount in accordance with the amplitude of the carrier wave and the length of time it is applied. An irradiation by a carrier wave of a designated amplitude and duration is commonly termed a "pulse."

Due to the orientation of the detector coil, detectable signals are generated only when the spins have been nutated away from their equilibrium direction (the direction of the static magnetic field). The maximum signal will be that resulting from a 90° nutation.

The initial effect of the irradiation is to cause the magnetic moments of the nuclei to rotate in phase, and thereby generate a detectable signal. The intensity of this signal decays, however, as the moments begin to spread out (dephase) due to both the exchange of energy between neighboring nuclei and nonhomogeneities in the magnetic field. This decay is known as the "free induction decay" (FID) and the time needed for the signal to decay to $1/e$ or approximately one-third of its initial value is called the $T_2^*$ relaxation time.

The signal can be regenerated, however, by reversing the spins to cause the magnetic moments to rotate in the opposite direction. When so reversed, the spins will pass back through the point where they are all in phase and a signal will reappear in the detector. The intensity of the signal will rise to a maximum at the point where the magnetic moments are precisely in phase, at least in phase to the highest degree possible. The time interval between this point and the instant at which the spin reversal took place will be exactly equal to the time interval between the initial (signal-generating) nutation and the spin reversal. This regenerated signal is commonly known as the "spin echo."

Further spin echoes can be generated by additional spin reversals. In each case, the spin echo will peak at a time interval following the spin reversal equal to the time interval between the previous spin echo peak and the spin reversal.

During all this time, the torque exerted on the nuclei by the magnetic field tends to realign the nuclei in the direction of the magnetic field. When complete realignment has been regained, the macroscopic magnetization will have returned to its equilibrium value and no signal will appear in the detector. The period of time required for this to happen depends on the particular value of the magnetic moment, and is commonly referred to as the "spin-lattice" or longitudinal relaxation time, with a characteristic time constant commonly designated $T_1$, referring to a decay factor of $1/e$. Although the spin-lattice relaxation is asymptotic in character, the time for total relaxation, within the normal limits of detection, will range from about 0.01 to about 20 seconds. A typical value for hydrogen nuclei in the bloodstream is about 700 milliseconds. This time period will generally be considerably longer than the spin-spin relaxation time.

Clearly, as the spin-lattice relaxation becomes more and more advanced, the signals will steadily decrease in intensity. In order to be detectable, therefore, all signals must remain within the spin-lattice relaxation time, and the closer these signals are to the original signal-generating excitation, the stronger and more easily detectable they will be.

Either the FID or a spin echo can be used in the process of the present invention as the signal from which flow determinations are made. Focusing on one or the other is readily achieved by selecting a particular relaxation time following the last irradiation for emphasis by the signal detector. Detection and emphasis of this kind is normally alone by computer, by incorporation into the imaging program as described in Section E below.

Among the FID and the spin echoes, one is often preferred over the others depending on the type of flow being measured. For example, blood flow in the region of the heart of a mammal and other high volume areas is relatively fast. The preferred signal for flow measurements in such regions is the FID since the latter will more closely reflect the blood in the selected region at the time the signal is read, and smaller time intervals between successive measurements can be used. The preferred signals for flow measurements in low volume areas are the spin echoes, since the multiple pulses needed for these signals permit greater spatial selectivity and precision.

B. Selectivity

A critical feature of this process is selectivity. The term is applied herein to both irradiation and signal generation, and designates a focusing on a predetermined volume to the exclusion of all others. The selected volume is generally a small portion of the volume of the entire object within the sensitivity range of the detector. Selectivity is needed both to isolate the region of interest and to detect flow through that region by measuring the effect of the flow on the intensity of the signal emanating from that region.

In preferred embodiments of the invention, the selected volume is a tomographic region (or "slice"), extending through the entire section of the object. The term "planar volume", will be used herein as commonly used in the art, to designate such a region. The term generally denotes the volume between two parallel planes wherein the distance between the planes is small in comparison to either transverse dimension in the planes themselves. The result is a flat thin volume of finite thickness.

The designation of a line as "perpendicular to" such a volume will refer herein to a line perpendicular to each of the two planes. "Parallel" planar volumes will designate two or more planar volumes where all of the broad planes are parallel. For purposes of the present invention the thickness of the planar volume is not critical, and can vary widely. For most applications, however, the thickness will generally range from about 0.01 cm to about 50 cm, preferably from about 0.1 cm to about 4 cm.

Methods of achieving a selective excitation are well known. Some techniques are based on the fact that precessing nuclei in a magnetic field will respond only to a transverse carrier wave whose frequency is the same as or close to the precession frequency. Since, as indicated above, the precession frequency is directly proportional to the intensity of the magnetic field, one means of achieving spatial selectivity is by imposing a gradient on the magnetic field so that its intensity varies as a function of position throughout the object. The entire object is then irradiated with a carrier wave having a frequency bandwidth which corresponds to the magnetic field range within the desired spatial region. As a result, only those nuclei within the desired region are affected, and all remaining nuclei are not.

The envelope shape of the carrier wave frequency for such an irradiation is not critical, provided only that it spans the necessary range in a continuous manner. A particularly convenient envelope shape is that defined by the relation $(\sin \omega t)/\omega t$.

When the selected volumes are planar volumes, the field intensity variation takes the form of a simple gradient in the direction perpendicular to the planar volume. For a carrier wave of given bandwidth, the thickness of the planar volume will depend on the magnitude of the magnetic field gradient. The gradient itself can vary widely, depending on the other system parameters and the procedure used, but for most applications will fall within the range of about 0.01 gauss/cm to about 10 gauss/cm, preferably about 0.5 gauss/cm to about 2 gauss/cm.

An undesirable feature of irradiation through a magnetic field gradient is a small degree of dephasing which occurs along the direction of the gradient. This tends to obscure all signals which are generated by excitations during the time period in which the gradient is present. This can be corrected by reversing the gradient after the pulse is applied, to generate an echo of the pulse. By then removing the gradient at the point in time corresponding to the peak of the echo, the pulse effects are brought back into phase. Thus, in general, the duration of the correction gradient will be one-half that of the initial gradient, provided that the gradients are equal and antiparallel and that the carrier wave is on for approximately the entire duration of the initial gradient. Signals occurring at subsequent points in time (such as the spin echo and spin echo replica signals discussed above) are likewise clearly focused.

An alternative to a simple magnetic field gradient for achieving selectivity is the use of a localized variation or discontinuity in the field, such as a "bulge" or "dip" in the field intensity in the region of interest along the axis which is in line with the direction of flow. This can be achieved by using an appropriate combination of coils—e.g., two coils of opposing polarity positioned adjacent each other with a gap in between, or other combinations readily apparent to those skilled in the art. A carrier wave envelope corresponding only to the intensity in the region of the discontinuity will then provide the selectivity. As a further and less precise alternative, a coil covering a limited region of small size can be used, thereby imparting its own selectivity. The latter is best adapted for high flow volume regions. With either of these techniques, phase correction of the type mentioned in the preceding paragraph is unnecessary.

Selective signal generation (i.e., signal generation from a selected volume) is the overall result sought to be achieved by selective excitation. When a series of pulses (timed irradiations) is required to generate the signal, selectivity in signal generation is achieved either by applying selectivity to each pulse, or by using a combination of whole object irradiation (no magnetic field gradient) for some pulses and selective excitation for others. The various combinations available for each of the known methods of signal generation will be readily apparent to those skilled in the art.

C. Depolarization (or Counterexcitation)

A critical feature of the method of the invention is the preliminary excitation of the nuclei which precedes the signal generating excitation. This preliminary excitation, referred to herein as either the depolarization, saturation, or counterexcitation pulse (or pulses) is an irradiation or series of irradiations designed to obliterate signals which might otherwise result from succeeding pulses, hence the term "counterexcitation." As with all excitations, this is an excitation away from the equilibrium state defined by the magnetic field, and the nuclei affected thereby undergo the same gradual spin-lattice relaxation. Consequently, the ability of the depolarization pulse to obliterate subsequently generated signals lessens as the time interval between the depolarization pulse and the signal generating pulses increases.

Depolarization is accomplished in any of several ways, depending to some extent on how the succeeding signal is generated. The most convenient depolarization methods are generally one of two types. The first is a specific reorientation of nuclear spins which, when combined with subsequent reorientations (i.e., the signal generating pulse) will produce no net component of magnetization in any direction detectable by the detector. The second is a general randomization of spins which itself results in no net magnetization in any direction, detectable or otherwise. It will be recalled that in the preferred method of signal generation described above, the first pulse is a 90° nuclear spin nutation. In such case, depolarization is most conveniently achieved by an identical 90° nutation, since the total of the two pulses (180°) results in no net magnetization component in the plane to which the signal receiver is oriented.

In the method of the present invention, depolarization (e.g., reorientation or saturation) is used to detect flow in the following manner. The depolarization pulse (or pulses) is selectively applied to the volume of interest. The signal generation pulse or pulse sequence is then selectively applied to the same volume, although after a preset time interval. During this interval a portion of the depolarized nuclei have flowed out of the selected volume, and nuclei unaffected by the depolarization pulse have flowed in to replace them. The latter produce a detectable signal, whose intensity is proportional to the degree to which the replacement has occurred.

As with all other excitations, the depolarization pulse serves to excite the nuclei away from their equilibrium state, and the nuclei immediately begin their slow return to equilibrium via spin-lattice relaxation. Thus, the ability of the depolarization pulse to obliterate signals generated by subsequent pulses lessens as the length of the time interval between the pulses increases. The result is an overall rise in signal intensity from the selected volume independent of the nuclei inflow effect. The total signal represents the sum of this contribution (the relaxation component) and the inflow contribution. Since the present invention relies on a series of signal measurements taken at varying time intervals between the depolarization and signal-generating pulses, the relaxation component is not constant and can achieve significant proportions, obscuring the overall result.

The relaxation component arises from both the flowing matter originally present in the selected volume which has not had sufficient time to flow out of the selected volume during the time interval between the depolarization and signal pulses, and the stationary matter (for example, blood vessel walls and surrounding tissue). There are a number of ways by which this component can be subtracted from the total signal. Some of these are as follows:

1. One method is to image the selected volume by the standard technique, i.e., generating and detecting a signal without the use of a preceding depolarization pulse, but emphasizing the same relaxation times. (Imaging is discussed in Section E below.) The image is then multiplied by a selected factor to adjust the brightness to the appropriate level for each flow signal measurement. Then, from each flow signal measurement is subtracted its appropriately adjusted image signal, leaving a series of difference images. In living tissue application, the latter will exhibit blood flow levels with the tissue relaxation effects either sharply reduced or eliminated entirely.

2. When the relaxation times for the moving and stationary mass are known to a good approximation, as they are in the case of blood and living tissue, the imaging computer can be programmed to subtract out the relaxation component from each signal element or pixel, and thereby isolate flow signals from static tissue signals. As in the preceding paragraph, adjustment of the relaxation component by subtraction, addition, multiplication, or division will be required for each pixel of each flow signal, a feature which is readily incorporated into the computer program. Further discussion of pixel generation appears in Section E below.

3. A further alternative is based on the known proportionality factor which defines the rate at which spin-lattice relaxation decreases signal intensity. This factor is $$1-\exp(-t/T_1)$$

where
t = time following excitation, and
$T_1$ = total spin-lattice relaxation time.
In conventional spin-echo generation, therefore, the relaxation component of the signal is $$\frac{1-\exp(-t/T_1)}{1-\exp(-B/T_1)} S_{max}$$

where
B = the pulse sequence repetition time for the signal, and
$S_{max}$ = the signal so generated in the absence of depolarization.

In most applications, the time interval between the depolarization and signal generating pulses will remain considerably less than the total spin-lattice relaxation time. The relaxation component can then be approximated by $$\frac{t}{B} S_{max}$$

This component is subtracted from the total signal in the manner indicated above.

4. In fast flow measurements, the relaxation component can be virtually eliminated by a proper adjustment of the thickness of the planar volume. By using a volume which is thin enough that its fill time is very small in comparison to the spin-lattice relaxation time, all flow signal measurements will be substantially free of relaxation effects. For example, with a flow of 100 cm/sec, a slice of 0.7 cm thickness is filled in 7 msec, and a slice of 1.0 cm thickness is filled in 10 msec. Since no substantial relaxation occurs in living tissue for times less than about 40 msec, the use of a slice of such dimensions will essentially circumvent any signals other than those related to flow where living tissue is involved.

5. When one is measuring blood flow rates, one can gate the measurements to correspond to the contractions and expansions of the heart, and thereby compare fast flow with slow flow. For example, the gating can be adjusted to take signals on both the systole and the diastole, then the latter subtracted from the former to provide a difference signal.

In general, the time interval between the depolarization and signal generating pulses can vary over a wide range, subject only to the requirement that all pulses in the signal generating sequence as well as the signals themselves remain within the spin-lattice relaxation time of the depolarization pulse. It will be apparent to those skilled in the art, that the best results will be obtained when the least amount of relaxation has occurred. Preferably, therefore, only time intervals less than or equal to about one-third of the total spin-lattice relaxation time will be used. Since the range of such time intervals must extend up to and beyond the fill time for the volume of interest, as seen below, the requisite time interval length range can be adjusted if necessary by adjusting the thickness of the inner volume, the strength of the magnetic field, and other variables readily apparent to those skilled in the art.

For convenience, the time interval between the depolarization and first signal generating pulses will be referred to herein as the "relaxation time interval," since it must fall within the total spin-lattice relaxation time for meaningful results to be obtained.

D. Fill Time Determination

In the method of the present invention, the volumetric flow rate through a selected region is determined by dividing the volume of that region by the time required to fully replace the nuclei in the region with new nuclei flowing in. This time is designated herein as the "fill time." The linear displacement rate through the region is obtained by dividing the volumetric flow rate by the cross-sectional area of the region. In plug flow, total replacement of nuclei in the region actually occurs during the fill time. This permits a determination of an actual linear velocity which is the value at every point in the cross-section. In laminar flow, however, total replacement does not occur. The fill time can still be used, however, to determine the average linear velocity over the entire cross section.

When the NMR signal is plotted as a function of the length of the relaxation time interval for a plug flow configuration, the result is approximately a straight line having a slope proportional to the volumetric flow rate, for time interval values less than the fill time. The signal for time intervals greater than the fill time is a horizontal line, reflecting the compensating effect of outflowing material. The point where the two lines intersect corresponds to the fill time. For laminar flow (i.e., where the velocity profile across the cross section in any given direction is parabolic), the straight lines are replaced by a continuous curve, having the same slope at the origin and approaching the horizontal line as an asymptote. The fill time is then determined from the point of intersection between the asymptote and the line tangent to the curve at the origin. In practice, this determination is made by computer which, when combining it with imaging (Section E below), provides fill times for all cross-sectional segments (e.g., blood vessels) of interest.

When signal generation is achieved by the preferred technique described above (i.e., an initial signal-generating excitation followed by one or more spin reversals), and all excitations in the sequence are applied to the same planar volume, the time interval coordinate of the point of intersection will be equal to the fill time minus the time interval between the first excitation and the last spin reversal. The latter term reflects the outflow of excited nuclei during that time interval. If, however, the spin reversals are selectively applied to a planar volume which is thicker than that to which the original signal generating excitation was applied, the curve will level off at a higher signal intensity and the time value of the point of intersection will rise. If the extra thickness is equal to the maximum distance traveled by nuclei within the slice during the pulse sequence, the time interval at the point of intersection will be the actual fill time. Thus, for a conventional spin-echo replica signal generation sequence, represented as follows:

$$90°\text{-}t_b\text{-}180°\text{-}2t_b\text{-}180°$$

the extra thickness will be $$3t_b v_{max},$$

where $v_{max}$ is the velocity of the fastest moving nucleus in the original volume. As explained above, the thickness of the planar volume is readily controlled by either the magnitude of the magnetic field intensity gradient or the frequency bandwidth of the carrier wave.

The volumetric flow rate itself can be taken directly from the curve, since the slope of the curve at the origin is equal to the product of the volumetric flow rate and the signal intensity per unit volume. This initial slope may be distorted, however, by either imperfect depolarization or spin-lattice relaxation. Neither type of distortion is seen at the break points, however. The flow rate can then be taken from the slope of a corrected line from the origin through the break point.

Various modifications of the above will be apparent to those skilled in the art. For example, the method could be modified to yield information on flow direction rather than merely magnitude, by applying the 180° (spin reversal) pulses to planar volumes having a greater thickness than those to which the 90° (initial signal-generating) pulse was applied, the different volumes overlapping and having one planar boundary in common. Flow in the direction of the offset would then produce a higher asymptote in the signal-time curve than flow in the opposite direction. As a further example, the planar volumes could be displaced so as not to overlap. The latter would be useful for fast flow rates.

In general, the number of repetitions, each at a different value of the relaxation time interval, is not critical provided that a sufficient number of points is generated to permit one to determine the break point of the curve. A minimum of about three repetitions will generally suffice, preferably at least about four repetitions. The time interval between the repetitions is also noncritical, provided that there is no interference with the signal generating ability of the next repetition. When the depolarization is a simple nutation rather than a general randomization of spins, the time interval between repetitions must be sufficient to permit full spin-lattice relaxation to occur.

When the selected volumes for the signal-generating excitations coincide with one another, or at least overlap, it is preferred to use a spin echo replica signal (i.e., the second spin echo) for the flow rate determination rather than the first spin echo itself. The reason for this lies in the phase distortion which occurs as a result of the flow of nuclei in the direction of a magnetic gradient. Since the direction of distortion is reversed every time the spins are reversed, this distortion can be eliminated by the use of the replica signal rather than the first spin-echo, provided that a proper combination of gradient magnitude and interpulse time intervals is used.

E. Two-Dimensional Imaging and Area Selection

In most applications, the magnetic field and the RF signal receiver are incapable of focusing on a small cross-sectional area, particularly when the latter lies within a large object. This problem arises, for example, when the blood flow rate in a specific blood vessel is sought, since only the entire body or an entire portion thereof (such as a limb, the torso, head, etc.) can be placed inside the equipment. By combining the methods described above with conventional NMR imaging techniques for providing a two-dimensional signal array, one can overcome this problem, and indeed generate specific data at any point in or portion of the cross-sectional plane.

Any conventional imaging technique capable of providing a two-dimensional array can be used provided, however, that the imaging does not interfere with the flow detection. Thus, only those imaging techniques involving excitation in parallel planar volumes, all selected volumes being perpendicular to the direction of flow, can be used.

One particularly useful technique involves a two-dimensional Fourier transform and is disclosed in the following publications:

Crooks et al., "Nuclear Magnetic Resonance Whole-Body Imager Operating at 3.5 KGauss", *Radiology*, 143(1): 169-174 (1982);

Edelstein et al., "Spin Warp NMR Imaging and Applications to Human Whole-Body Imaging", *Phys. Med. Biol.*, 25(4): 751-6 (1980);

Kumar et al., "NMR Fourier Zeuamatography", *J. Mag. Res.*, 18: 69-83 (1975).

Briefly, this imaging technique provides position discrimination in one direction within the plane by imposing a magnetic field gradient in that direction during the period of time when the spin echo or spin echo replica signals (whichever are to be used for the measurement) will occur. The total signal will then cover a range of frequencies which can be broken down into its components by Fourier transform treatment, and each component then translated into a position along the axis in this first direction. Discrimination along the second direction, perpendicular to the first, is achieved by imposing a magnetic field gradient in the second direction, at some point in time during the pulse sequence prior to the signal occurrences, for a preset period of time. This places the spins out of phase with each other by an amount proportional to the position along the Y direction. The entire procedure is repeated a number of times, each time varying the degree to which the spins are placed out of phase. This is done either by varying the time during which the gradient is applied, varying the magnitude of the gradient, or using similar techniques which are readily apparent to those skilled in the art. The signals from each of these repetitions are totalled for each unit of length in the first direction. Any signals which occur will then go in and out of phase at a rate depending on the degree of phase spread. This frequency is then translated by Fourier transform to a position along the second direction. The final result of the two-dimensional Fourier transform is a rectangular array of signals. Clearly, the number of pixels in the array is not critical provided that it provides sufficient resolution for the area in which measurement is desired. For digital equipment, a convenient array is a square having 128 elements in each direction.

Using further known computational techniques, signals for a specific area within the rectangular array can be isolated and totalled. This method permits determination of flow data for specific areas of interest. This method, which is a simple extrapolation of general imaging procedures, uses specific "tailored" frequency bands to image specific regions with tailored magnetic field regions.

Flow data is obtained by incorporating the imaging method into the fill time determination. Thus, a full two-dimensional image (or the determination of signals from a portion thereof) is generated for each point in the curve of signal intensity versus relaxation time interval.

The method described herein can be performed on conventional apparatus known and presently used for medical imaging by NMR. Extensive descriptions of such apparatus are to be found in the two Crooks et al. patents referenced above (U.S. Pat. Nos. 4,297,637 and 4,318,043), and the references cited therein, as well as Crooks et al., "Nuclear Magnetic Resonance Whole- Body Imager Operating at 3.5 KGauss," *Radiology*, 143(1): 169–174 (1982), and the references cited therein. Each of these documents is incorporated herein by reference.

The foregoing description is offered primarily for purposes of illustration. While a variety of embodiments have been disclosed, it will be readily apparent to those skilled in the art that numerous modifications and variations not mentioned herein can still be made without departing from the spirit and scope of the invention as claimed hereinbelow.

What is claimed is:

1. A method for generating a detectable signal related to the rate of linear displacement, in a predetermined direction, of nuclei within an object under the influence of a static unidirectional magnetic field and within the range of an NMR detector oriented to detect a zero signal when the spins of said nuclei are equilibrated to precessions at Larmor frequencies in accordance with the intensity of said magnetic field and a positive signal when said spins are excited away from said equilibrated state by a predetermined energy increment, said method comprising:
    (a) equilibrating the spins of said nuclei to precess at said Larmor frequencies,
    (b) selectively exciting a predetermined volume within said object to an extent which would be sufficient to generate a net NMR signal of zero when combined with the excitation corresponding to said predetermined energy increment,
    (c) selectively exciting said volume by said predetermined energy increment at a first predetermined relaxation time interval after the excitation of step (b) but within the full spin-lattice relaxation time thereof to generate a detectable NMR response, and
    (d) repeating steps (b) and (c) in sequence at least once using further predetermined relaxation time intervals of differing duration.

2. The method of claim 1 wherein said predetermined volume of steps (b) and (c) is a planar volume substantially perpendicular to said displacement direction, and said NMR response is a signal selected from the group consisting of the free induction decay, a first spin echo, and second and subsequent spin echoes.

3. The method of claim 1 wherein said predetermined volume of steps (b) and (c) is a planar volume substantially perpendicular to said displacement direction with a thickness ranging from about 0.1 cm to about 15 cm.

4. The method of claim 1 wherein said predetermined volume of steps (b) and (c) is a planar volume substantially perpendicular to said displacement direction with a thickness ranging from about 0.25 cm to about 5 cm 5. The method of claim 1 wherein step (c) comprises selectively exciting a first planar volume substantially perpendicular to said displacement direction to nutate the nuclear spins of nuclei in said volume by a predetermined angle capable of generating a detectable signal in said detector, and said NMR response is at least a substantial portion of the free induction decay.

6. The method of claim 5 wherein said predetermined angle is approximately 90°.

7. The method of claim 1 wherein step (c) comprises:
    (c') selectively exciting a first planar volume substantially perpendicular to said displacement direction to nutate the nuclear spins of nuclei in said volume by a predetermined angle capable of generating a detectable signal in said detector, and
    (c'') selectively exciting a second planar volume substantially parallel to said first planar volume, at a predetermined inter-pulse time interval thereafter, to reverse the spins of nuclei in said second volume, said second volume having been preselected to contain, at the time of said excitation, at least a portion of the nuclei excited in step (c'), whereby the nuclei subjected to both said excitations thereafter generate spin echo signals at times in accordance with said inter-pulse time interval, said first and second planar volumes collectively comprising said predetermined volume of steps (b) and (c).

8. The method of claim 7 wherein said predetermined angle is approximately 90°.

9. The method of claim 7 wherein said first and second volumes fully coincide.

10. The method of claim 7 wherein said second volume encompasses said first volume and is thicker than said first volume by an amount approximately equal to the displacement undergone, during said inter-pulse time interval, by the fastest moving nuclei in said first volume.

11. The method of claim 10 wherein said second volume and said first volume have a planar boundary in common and overlap with each other.

12. The method of claim 7 wherein said first and second volumes do not overlap.

13. The method of claim 1 wherein step (c) comprises:
    (c') selectively exciting a first planar volume substantially perpendicular to said displacement direction to nutate the nuclear spins of nuclei in said volume by a predetermined angle capable of generating a detectable signal in said detector,
    (c'') selectively exciting a second planar volume substantially parallel to said first planar volume, at a predetermined inter-pulse time interval thereafter, to reverse the spins of nuclei in said second volume, said second volume having been preselected to contain, at the time of said excitation, at least a portion of the nuclei excited in step (c'), whereby the nuclei subjected to both said excitations thereafter generate spin echo signals at times in accordance with said inter-pulse time interval, said first and second planar volumes collectively comprising said predetermined volume of steps (b) and (c), and
    (c''') selectively exciting a third planar volume substantially parallel to said first and second planar volumes, at a second predetermined inter-pulse time interval after said spin echo signals, to reverse the nuclear spins of nuclei in said third volume, said third volume having been preselected to contain, at the time of said excitation, at least a portion of the nuclei excited both in step (c') and in step (c''), whereby the nuclei subjected to all three excitations thereafter generate replica signals of said spin echo signals in accordance with said second inter-pulse time interval, said first, second, and third planar volumes collectively comprising said predetermined volume of steps (b) and (c).

14. The method of claim 13 wherein said predetermined angle is approximately 90°.

15. The method of claim 13 wherein said first and third volumes fully coincide.

16. The method of claim 13 wherein said third volume encompasses said first volume and is thicker than said first volume by an amount approximately equal to the displacement undergone, during the sum of said inter-pulse time intervals, by the fastest moving nuclei in said first volume.

17. The method of claim 16 wherein said third volume and said first volume have a planar boundary in common and overlap with each other.

18. The method of claim 13 wherein said first volume and said third volume do not overlap.

19. The method of claim 1 wherein step (c) comprises selectively exciting a first planar volume substantially perpendicular to said displacement direction to nutate the nuclear spins of nuclei in said volume by a predetermined angle capable of generating a detectable signal in said detector; said NMR response is a signal selected from the group consisting of the free induction decay, a first spin echo thereof, and second and subsequent spin echoes thereof; and step (b) comprises irradiating said volume with at least one pulse to nutate the nuclear spins of nuclei within said volume by an angle selected such that the sum of said angle and the predetermined angle of step (c) is 180°.

20. The method of claim 19 wherein the predetermined angle of step (c) is approximately 90° and step (b) comprises nutating the nuclear spins of nuclei within said volume by approximately 90°.

21. The method of claim 1, 2, 3, 4, 5, 6, 7, 8, 9, 10, 11, 12, 13, 14, 15, 16, 17, 18, 19, or 20 wherein steps (b) and (c) are repeated in sequence a sufficient number of times, using further predetermined relaxation time intervals of differing duration, to generate a curve of NMR response signal intensity vs. relaxation time interval sufficient to permit the determination of the relaxation time interval corresponding to the point of intersection of the line tangent to said curve at a relaxation time interval of zero and the horizontal asymptote of said curve.

22. The method of claim 1 wherein said selective excitations and counterexcitations comprise:
modulating said magnetic field to produce a position variant field intensity whereby the intensity at all points within said predetermined volume falls within a predetermined range and the intensity at all other points falls outside said range, and
irradiating said object with a carrier having a frequency bandwidth equal to the Larmor frequency bandwidth corresponding to said predetermined field intensity range.

23. The method of claim 1 wherein step (c) comprise selectively exciting a first planar volume substantially perpendicular to said displacement direction to nutate the nuclear spine of nuclei in said volume by a predetermined angle capable of generating a detectable signal in said detector; said NMR response is a signal selected from the group consisting of the free induction decay, a first spin echo thereof, and second and subsequent spin echoes thereof; and step (b) comprises irradiating said volume with at least one pulse to nutate the nuclear spins of nuclei within said volume in random manner resulting in no net magetization in any direction.

24. A method for generating a numerical value related to the rate of linear displacement, in a predetermined direction, of nuclei within an object under the influence of a static unidirectional magnetic field and within the range of sensitivity of an NMR detector oriented to detect only those components of nuclear magnetization lying perpendicular to the direction of said magnetic field, said method comprising:

(a) aligning the spins of the nuclei within said object in the direction of said magnetic field,
(b) selectively exciting a predetermined planar volume within said object and substantially perpendicular to said predetermined displacement direction, to nutate the nuclear spins of nuclei within said volume by approximately 90°,
(c) selectively exciting a first planar volume within said predetermined planar volume to nutate the spins of nuclei therein by approximately 90°, at a first predetermined relaxation time interval after the excitation of step (b),
(d) selectively exciting a second planar volume within said predetermined volume, at a first predetermined interpulse time interval after the excitation of step (c), to nutate the nuclear spins of nuclei in said second volume by approximately 180°, said second volume having been preselected to contain, at the time of said nutation, at least a portion of the nuclei nutated in step (c), whereby the nuclei subjected to both the 90° nutation of step (c) and the 180° nutation thereafter generate spin echo signals at times in accordance with said first interpulse time interval,
(e) selectively exciting a third planar volume within said predetermined volume, at a second predetermined interpulse time interval after said spin echo signals, to nutate the nuclear spins of nuclei in said third volume by approximately 180°, said third volume having been preselected to contain, at the time of said nutation, at least a portion of the nuclei nutated in both step (c) and step (d), whereby the nuclei subjected to the 90° nutation of step (c) and both 180° nutations thereafter generate replica signals of said spin echo signals in accordance with said second interpulse time interval,
said first, second, and third planar volumes all being substantially perpendicular to said predetermined displacement direction and collectively comprising said predetermined planar volume of step (b), and the excitations of steps (c), (d), and (e) and said spin echo and spin echo replica signals all occurring within the spin-lattice relaxation time of the excitation of step (b), and
(f) repeating steps (a), (b), (c), (d) and (e) in sequence, using further predetermined relaxation time intervals of differing duration, to generate a curve of spin echo replica signal intensity vs. relaxation time interval sufficient to permit the determination of the relaxation time interval corresponding to the point of intersection of the line tangent to said curve at a relaxation time interval of zero and the horizontal asymptote of said curve 25. The method of claim 24 wherein each said selective excitation comprises
modulating said magnetic field to produce a field intensity gradient perpendicular to the planar volume so excited, whereby the intensity at all points within said volume falls within a predetermined range and the intensity at all other points falls outside said range, and
irradiating said object with a carrier having a frequency bandwidth equal to the Larmor frequency bandwidth corresponding to said predetermined field intensity range.

26. The method of claim 25 wherein said gradient is from about 0.01 gauss/cm to about 10 gauss/cm.

27. The method of claim 25 wherein said gradient is from about 0.5 gauss/cm to about 2 gauss/cm.

28. The method of claim 24, 25, 26 or 27 wherein said magnetic field is oriented either substantially perpendicular to or substantially parallel to said displacement direction.

29. The method of claim 24, 25, 26 or 27 wherein said magnetic field is oriented substantially parallel to said displacement direction.

30. The method of claim 24, 22, 25, 26 or 27 wherein said nuclei are hydrogen ions in the blood stream of a living animal.

31. A method for generating a numerical value related to the rate of linear displacement, in a predetermined direction, of nuclei at a predetermined location in a plane perpendicular to said displacement direction inside an object under the influence of a static unidirectional magnetic field aligned either parallel to or prependicular to said displacement direction and within the range of sensitivity of an NMR detector oriented to detect only those components of nuclear magnetization lying perpendicular to the direction of said magnetic field, said method comprising:

(a) aligning the spins of the nuclei within said object in the direction of said magnetic field, (b) modulating said magnetic field, for a first time period, to produce a field intensity gradient parallel to said displacement direction, whereby the field intensity at all points within a predetermined planar volume encompassing said plane and perpendicular to said gradient falls within a predetermined range and the intensity at all other points falls outside said range, (c) irradiating said object during said first time period with a carrier having a frequency bandwidth equal to the Larmor frequency bandwidth corresponding to said predetermined field intensity range, to nutate the spins of nuclei within said volume by approximately 90°, (d) repeating step (b) for a second time period, using a gradient of either the same or a different magnitude and an average field intensity of either the same or a different magnitude, (e) repeating step (c) during said second time period at a first predetermined relaxation time interval after the irradiation of step (c), using a frequency bandwidth corresponding to a first planar volume within the planar volume of step (b), (f) modulating said magnetic field for a third time period following said second time period, to produce a field intensity gradient perpendicular to said displacement direction and thereby vary the rate of precession of the nuclei in said object in the direction of said gradient to produce a phase shift in a predetermined fixed proportion to the position of said nuclei in the direction of said gradient, (g) repeating step (b) for a fourth time period following said third time period, using a gradient of either the same or a different magnitude and an average field intensity of either the same or a different magnitude as that of step (b), (h) irradiating said object, during said fourth time period, at a first predetermined interpulse time interval after the irradiation of step (e), with a carrier having a frequency bandwidth equal to the Larmor frequency bandwidth corresponding to the field intensity range of a second planar volume within the planar volume of step (b), to reverse the spins of nuclei within said second planar volume, said second planar volume having been preselected to contain, at the time of said spin reversal, at least a portion of the nuclei nutated in step (e), whereby the nuclei subjected to both the nutation of step (e) and said spin reversal thereafter generate spin echo signals in accordance with said first interpulse time interval, (i) repeating step (b) for a fifth time period following said spin echo signals, using a gradient of either the same or a different magnitude and an average field intensity of either the same or a different magnitude as that of step (b), (j) irradiating said object, during said fifth time period, at a second predetermined inter-pulse time interval after said spin echo signals, with a carrier having a frequency bandwidth equal to the Larmor frequency bandwidth corresponding to the field intensity range of a third planar volume within the planar volume of step (b), to reverse the spins of nuclei within said third planar volume, said third planar volume having been preselected to contain at least a portion of the nuclei both nutated in step (e) and reversed in step (h), whereby the nuclei subjected to the nutation of step (e) and both said spin reversals thereafter generate replica signals of said spin echo signals in accordance with said second interpulse time interval, (k) modulating said magnetic field, during the occurrence of said replica signals, produce a field intensity gradient perpendicular to both the gradient of step (b) and the gradient of step (f)

said first, second and third planar volumes collectively comprising said predetermined planar volume of step (b); and the nutation of step (e), the spin reversals of steps (h) and (j), and said spin echo and spin echo replica signals all occurring within the spin-lattice relaxation time of the nutation of step (c);

(l) determining the relative intensities of said replica signals for a plurality of frequency components, and relating the frequency of each said component to a corresponding magnetic field intensity along the direction of the gradient of step (k) according to the Larmor equation, (m) repeating steps (a) through (l) in sequence at least once, each time varying only the predetermined fixed proportion of step (f), and relating, for each component of step (l), the frequency of the replica signal for each repetition to a corresponding phase shift along the direction of the gradient of step (f), (n) selecting spin echo replica signals to correspond to said predetermined location, and (o) repeating steps (a) through (m) in sequence, each time varying only the predetermined relaxation time interval of step (e), a sufficient number of times to generate a curve of the intensity of the signals selected in step (n) vs. relaxation time interval sufficient to permit the determination of the relaxation time interval corresponding to the point of intersection of the line tangent to said curve at a relaxation time interval of zero and the horizontal asymptote of said curve.

32. The method of claim 31 further comprising correcting the signals of step (l) for contributions due to spin-lattice relaxation occurring during said first predetermined relaxation time period of step (e).

33. The method of claim 31 further comprising reversing magnetic field grad t after one or more of said first, second, fourth and fifth time periods, and maintaining said reversed gradient for a sufficient period of time to eliminate or substantially reduce any dephasing occurring along the direction of the gradient during said time period.

34. The method of claim 31, 32 or 33 wherein said nuclei are hydrogen ions in the blood stream of a living animal or human.

* * * * *